United States Patent
Glazunov

(10) Patent No.: US 8,080,919 B2
(45) Date of Patent: Dec. 20, 2011

(54) PIEZOELECTRIC MULTILAYER COMPONENT

(75) Inventor: Alexander Glazunov, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/731,028

(22) Filed: Mar. 24, 2010

(65) Prior Publication Data

US 2010/0225205 A1    Sep. 9, 2010

Related U.S. Application Data

(63) Continuation of application No. PCT/EP2008/062858, filed on Sep. 25, 2008.

(30) Foreign Application Priority Data

Sep. 26, 2007 (DE) .......................... 10 2007 046 077

(51) Int. Cl.
*H01L 41/08* (2006.01)
(52) U.S. Cl. ....................................... 310/328; 310/366
(58) Field of Classification Search .................. 310/328, 310/358, 359, 366
See application file for complete search history.

(56) References Cited

U.S. PATENT DOCUMENTS

| | | | | |
|---|---|---|---|---|
| 5,196,757 A * | 3/1993 | Omatsu | ........................... | 310/358 |
| 5,245,734 A * | 9/1993 | Issartel | ........................ | 29/25.35 |
| 6,285,116 B1 | 9/2001 | Murai et al. | | |
| 7,073,265 B2 * | 7/2006 | Senoo et al. | ..................... | 30/364 |
| 7,208,862 B2 * | 4/2007 | Florian et al. | ................. | 310/366 |
| 7,358,655 B2 * | 4/2008 | Ragossnig et al. | ............ | 310/358 |
| 7,420,319 B2 * | 9/2008 | Kastl et al. | ..................... | 310/363 |
| 7,594,309 B2 | 9/2009 | Iwase et al. | | |
| 7,598,660 B2 | 10/2009 | Kobayashi et al. | | |
| 2007/0124903 A1 | 6/2007 | Iwase et al. | | |
| 2007/0269667 A1 | 11/2007 | Kobayashi et al. | | |
| 2010/0072306 A1 | 3/2010 | Ono | | |

FOREIGN PATENT DOCUMENTS

| | | |
|---|---|---|
| DE | 101 34 787 A 1 | 1/2003 |
| DE | 10 2004 031 404 A1 | 2/2006 |
| DE | 10 2006 035 470 A1 | 6/2007 |
| DE | 10 2006 026 644 A1 | 12/2007 |
| WO | WO-2006/087871 A1 | 8/2006 |
| WO | WO-2007/141133 A2 | 12/2007 |
| WO | WO-2008/038683 A1 | 4/2008 |

* cited by examiner

*Primary Examiner* — Mark Budd
(74) *Attorney, Agent, or Firm* — Slater & Matsil, L.L.P.

(57) ABSTRACT

A piezoelectric multilayer component includes a stack of piezoceramic layers and electrode layers arranged one above another. At least one piezoceramic layer is printed with a layer structured according to a predefined pattern in a piezoelectrically inactive zone of the stack. The structured layer has at least one connecting element by which piezoceramic layers that are adjacent in the stacking direction are mechanically connected to one another with a first strength. The structured layer has interspaces filled at least in part with piezoceramic material of the adjacent piezoceramic layers. The adjacent piezoceramic layers in the interspaces are mechanically connected to one another with a second strength, which is less than the first strength.

13 Claims, 2 Drawing Sheets

PIEZOELECTRIC MULTILAYER COMPONENT

This application is a continuation of co-pending International Application No. PCT/EP2008/062858, filed Sep. 25, 2008, which designated the United States and was not published in English, and which claims priority to German Application No. 10 2007 046 077.7 filed Sep. 26, 2007, both of which applications are incorporated herein by reference.

TECHNICAL FIELD

A description is given of a piezoelectric multilayer component, in particular a piezoelectric multilayer component comprising piezoceramic layers that can be intentionally delaminated in part.

BACKGROUND

In many designs of piezoelectric multilayer components, electrode layers are applied only on a part of a piezoceramic layer. The remaining region on the piezoceramic layer is, therefore, electrically insulating in order to avoid short circuits between an external contact and an electrode layer of opposite polarity. This region free of an electrode layer can be referred to as an inactive zone.

Since the electrical operating voltage between electrode layers of opposite polarities is applied only in the central region, that is to say in the active zone of the multilayer component, only this central region can expand on account of the inverse piezoelectric effect. In this case, the piezoceramic layers arranged between electrode layers of identical polarity expand to a lesser extent, such that a mechanical clamping can occur between the inactive zone and the active zone of the multilayer component. This clamping effect reduces the total expansion of the multilayer component, which constitutes a disadvantage for the application thereof.

PCT patent publication WO 2006/087871-A1 and corresponding U.S. Pat. No. 7,598,660 disclose a piezoelectric multilayer component comprising laterally fitted, crack-inducing, electrically conductive layers.

SUMMARY OF THE INVENTION

In one aspect, the present invention specifies a piezoelectric multilayer component that has an improved expansion distance. In another aspect, the invention specifies a piezoelectric multilayer component that has an improved expansion distance and remains functionally operational over a longer period of time.

A piezoelectric multilayer component includes a stack of piezoceramic layers and electrode layers arranged one above another. At least one piezoceramic layer is printed with a layer structured according to a predefined pattern in a piezoelectrically inactive zone.

The structured layer has at least one connecting element by which piezoceramic layers that are adjacent in the stacking direction are mechanically connected to one another with a first strength.

The structured layer has, alongside the connecting elements, interspaces filled with piezoceramic material of the adjacent piezoceramic layers. The interspace can be filled with the piezoceramic material completely or only in part, that is with gaps remaining. In this case, the mechanical connection between the adjacent piezoceramic layers in the interspace or in the region of the interspace alongside the connecting elements has a second strength, which is less than the first strength mentioned above. In particular, the second strength of the mechanical connection between the adjacent piezoceramic layers is less than the strength of the mechanical connection between the adjacent piezoceramic layers in the active zone of the multilayer component.

Since the interspace alongside the connecting elements of the structured layer is filled with a piezoceramic material, such that the adjacent piezoceramic layers are thereby mechanically connected to one another, the structured layer can also be regarded as a continuous layer, that is to say uninterrupted or at least an almost uninterrupted layer. In this case, the structured layer has regions that are connected to the adjacent piezoceramic layer with a higher strength mechanically than other regions of the structured layer.

The connecting elements of the structured layers furthermore ensure that two piezoceramic layers that are adjacent in the stacking direction form a mechanical contact with one another at their respective edge regions, in particular, in order that the multilayer component is not broken or destroyed during its production, before the pressing of the stack.

The structured layer is situated at least in the inactive zone of the multilayer component which is subjected to the clamping effect described. However, it can reach into the active zone further within the multilayer component. Connecting elements and also the spaces alongside them can, therefore, reach into the active zone of the multilayer component.

On account of the regions in which the adjacent piezoceramic layers in the inactive zone are connected to one another with reduced strength, the piezoceramic layers can delaminate in part when an operating voltage is applied to the multilayer component. They are entrained by the expansion of the multilayer component in the central region or in its active zone with reduced resistance. It is thereby possible to avoid or at least reduce a clamping effect between the active zone and the inactive zone of the multilayer component. It is thus possible to increase the total expansion distance of the piezoelectric multilayer component, in particular in the axially central region of the stack. Furthermore, the partial delaminatability of the piezoceramic layers in the inactive zone on account of the lesser mechanical connection there produces the advantageous effect that the multilayer component is mechanically relieved there with respect to tensile and/or clamping stresses, such that uncontrolled cracking within the stack, in particular between two electrode layers of opposite polarities, cannot occur. Consequently, the duration of the functional operability of the piezoelectric multilayer component can also be lengthened.

In accordance with one embodiment, the structured layer includes cylindrical connecting elements, which could have a circular or a polygonal contour. As an alternative, the at least one connecting element is lattice-shaped, wherein a plurality of lines composed of material printed on the piezoceramic layer cross one another and in the process enclose interspaces filled with material of adjacent piezoceramic layers.

In addition or as an alternative, a connecting element of a structured layer can be ring-shaped.

In accordance with one embodiment of the multilayer component, a plurality of ring-shaped connecting elements of a structured layer are arranged alongside one another concentrically on a piezoceramic layer and connect adjacent piezoceramic layers in the stack to one another. Interspaces filled with the material of adjacent piezoceramic layers are present alongside and/or between the ring-shaped connecting elements.

Regardless of the embodiments described, the connecting elements and/or the regions filled with piezoceramic material alongside them can be shaped in any desired manner. Preferably, the structured layer has a plurality of connecting elements distributed uniformly on the piezoceramic layer. In this case, the connecting elements can be arranged substantially homogeneously and/or equidistantly with respect to one another.

The electrode layers of the stack preferably contain one of the following materials and/or alloys: silver, palladium, nickel, copper.

The piezoceramic layers preferably contain a ceramic based on lead zirconate titanate (PZT).

It is preferred for the structured layer and/or a connecting element of the layer to contain a material that is contained in a piezoceramic layer connected to it. In this case, undesirable chemical reactions, in particular during the production of the multilayer component, between the structured layer and a piezoceramic layer connected to it are advantageously avoided. In addition or as an alternative, the structured layer and/or an at least one connecting element comprised by it can contain a metal that is also contained in an electrode layer.

In accordance with one embodiment of the multilayer component, the structured layer is arranged on the same piezoceramic layer as an electrode layer. However, it can also be arranged on a different piezoceramic layer than on one on which an electrode layer is arranged. This affords the advantage that, with a suitable mask comprising different patterns, in each case for an electrode layer and for a structured layer, an electrode layer and a structured layer of the type described can be simultaneously applied to a piezoceramic layer.

Preferably, a plurality of structured layers on a plurality of piezoceramic layers are distributed over the height of the stack of the multilayer component. A clamping effect reduced cumulatively thereby increases the achievable expansion distance of the piezoelectric multilayer component advantageously even further.

The electrode layers of the multilayer component are preferably contact-connected to an external contact embodied as a layer, the external contact being arranged on an outer area of the stack that runs parallel to the stacking direction. Other forms of an external contact are possible, however, such as in cable form or bar form, for example.

The piezoceramic layer printed with a structured layer can be a piezoceramic layer already printed with an electrode layer. In this case, the structured layer is applied, preferably at a distance from the electrode layer, to the piezoceramic layer alongside the electrode layer.

Between piezoceramic layers printed with electrode layers, in accordance with one embodiment, a plurality of unprinted piezoceramic layers can be stacked one above another. These can in each case be printed with structured layers of the type described.

A method for producing a piezoelectric multilayer component is specified, wherein a stack of electrode layers and printed piezoceramic layers is formed. Piezoceramic green sheets and electrode material respectively printed as a layer onto such green sheets are involved in this case. During stacking, the piezoceramic sheets can already be thermally pretreated and/or already contain additives that promote their handleability during production and/or transport. Organic binders can be involved in this case.

Prior to stacking, at least one piezoceramic layer is printed at least in a piezoelectrically inactive zone in the respective edge region of the piezoceramic layer with a layer structured with a predefined pattern.

The predefined pattern of the structured layer printed onto the at least one piezoceramic layer produces connecting elements and interspaces present between the latter, the interspaces initially being cavities or gaps. The connecting elements connect adjacent piezoceramic layers to one another during and after stacking.

The at least one piezoceramic layer is preferably printed with the aid of a screen printing method. The pressing of a material through the holes or cutouts in the screen produces the pattern, in particular the connecting elements of the pattern. The material can be a piezoceramic material or an electrically conductive material, in particular also a material that is used for the electrode layers.

The stack can subsequently be pressed, such that piezoceramic layers soften slightly and their respective material flows into the gaps or interspaces of a structured layer arranged between them. Specifically, it has been observed during pressing that under pressure and elevated temperature the piezoceramic layers liquefy enough to fill the gaps of the structured layer at least enough such that they are mechanically connected in the interspace alongside the connecting elements. However, this gives rise to a mechanical connection between the adjacent piezoceramic layers in the interspaces, which is not as strong as the mechanical connection between the piezoelectric layers that is produced by the connecting elements during the pressing.

The reason for the lesser second strength of the mechanical connection between the adjacent piezoelectric layers in the interspaces resides in the fact that there the connection is achieved not primarily by means of a pressing force, but rather merely by means of the mixing and binding of the materials of the piezoceramic layers that take place in the interspaces available for this purpose.

BRIEF DESCRIPTION OF THE DRAWINGS

The subjects described are explained in greater detail on the basis of the following figures and exemplary embodiments. In this case.

The following list of reference symbols can be used in conjunction with the drawings:

| | |
|---|---|
| 1 | Stack comprising piezoceramic layers and electrode layers |
| 2 | Piezoceramic layer |
| 3 | Electrode layer |
| 4 | Structured layer |
| 4a | Connecting element of a structured layer |
| 4b | Interspace alongside a connecting element |
| 5a | First external contact |
| 5b | Second external contact |
| IZ | Inactive zone of the stack |
| AZ | Active zone of the stack |

DETAILED DESCRIPTION OF ILLUSTRATIVE EMBODIMENTS

Figure 1A:
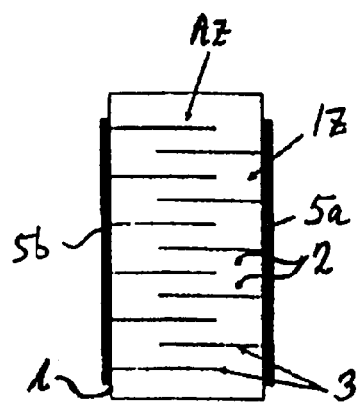
FIG. 1A shows a piezoelectric multilayer component in a longitudinal section.

FIG. 1A shows a longitudinal section of a piezoelectric multilayer component comprising a stack 1 of piezoceramic layers 2 and electrode layers 3 arranged one above another. The space filled exclusively with a dielectric between two electrode layers 3 of identical polarity forms an inactive zone IZ and the region—which overlaps in orthogonal projection—between electrode layers 3 of opposite polarities is an active zone AZ of the multilayer component. The active zone expands in a longitudinal direction when an operating voltage is applied. External contacts 5a and 5b embodied as layers are also shown. The contacts 5a and 5b are arranged at the side areas of the multilayer component and extend perpendicularly to the piezoceramic layers 2. A plurality of piezoceramic layers 2 can be present between two adjacent electrode layers 3. The external contacts 5a, 5b can be fired on by means of a metal paste or be galvanically applied to the side area(s) of the stack.

Figure 1B:
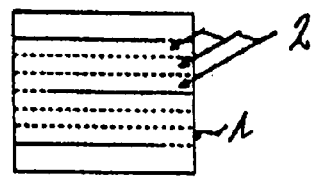
FIG. 1B shows a piezoelectric multilayer component in a lateral cross-sectional view.

FIG. 1B is a lateral cross-sectional view of a part of a stack 1. A plurality of piezoceramic layers 2 are arranged or stacked one above another between two electrode layers 3 that are adjacent in the stacking direction. The interrupted lines in the figure show the boundaries between two adjacent piezoceramic layers.

FIGS. 2A to 2E, respectively, show regions of a multilayer component having a construction in accordance with FIG. 1A and FIG. 1B.

Figures 2A, 2B, 2C, 2D, 2E:
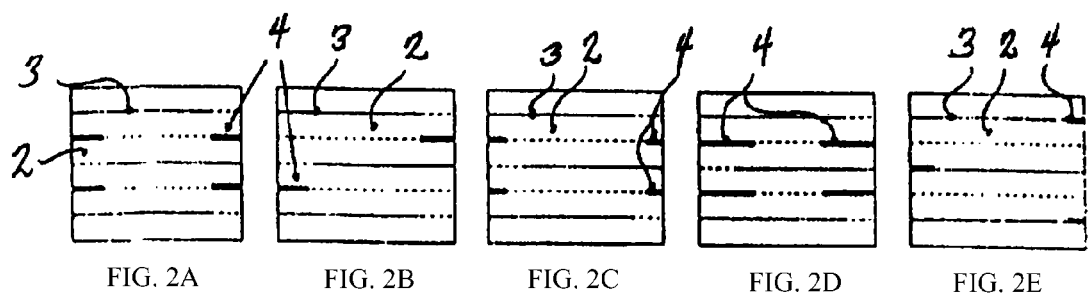
FIG. 2A shows a lateral cross-sectional view of a region of a multilayer stack with structured layers which are applied on both edge regions of a single piezoceramic layer.
FIG. 2B shows a lateral cross-sectional view of a part of a multilayer stack with structured layers which are applied individually on different piezoceramic layers.
FIG. 2C shows a lateral cross-sectional view of a part of a multilayer stack with a plurality of structured layers which are applied on a common piezoceramic layer and which are situated exclusively in an inactive zone.
FIG. 2D shows a lateral cross-sectional view of a part of a multilayer stack with a plurality of structured layers which are applied on common piezoceramic layers and which are situated both in an inactive zone and in an active zone.
FIG. 2E shows a lateral cross-sectional view of a part of a multilayer stack with individual structured layers which are applied on different piezoceramic layers and are arranged alongside electrode layers.

FIG. 2A shows, on the basis of horizontal lines depicted in bold, the positions of structured layers 4 by means of which piezoceramic layers 2 that are adjacent in the stacking direction are connected to one another mechanically with lesser strength than they are connected to one another further within the stack. A plurality of structured layers 4 situated in the edge region of the piezoceramic layer 2 are applied on each piezoceramic layer 2. The structured layers preferably lie opposite one another on a common piezoceramic layer 2.

FIG. 2B shows a sectional view of the piezoelectric multilayer component in accordance with FIG. 2A, wherein a single structured layer 4 is present on respectively one piezoceramic layer 2 between two electrode layers 3 that are adjacent in the stacking direction.

That part of the stack of a multilayer component that is illustrated by FIG. 2C corresponds to that in FIG. 2A, but with the difference that the areal extents of the structured layers 4 parallel to the piezoceramic layer are smaller than those in accordance with FIG. 2A. In particular, the structured layers 4 are only arranged in inactive zones IZ (see FIG. 1A) of the stack 1 in which nominally no or only a minimal expansion—brought about by a piezoelectric effect—of the stack in a longitudinal direction occurs.

FIG. 2D is a sectional view of the piezoelectric multilayer component in accordance with FIG. 2A and FIG. 2C, wherein two structured layers 4 are arranged in each case on a piezoceramic layer 2 arranged between two electrode layers 3 that are adjacent in the stacking direction. The area extents parallel to the piezoceramic layer of the structured layers 4 are larger than those shown in accordance with the illustrations in FIGS. 2A and 2C, the structured layers extending from active zones AZ between adjacent electrode layers 3 of opposite polarities as far as a side area on which an external contact 5a or 5b in accordance with FIG. 1A can be arranged.

Looking back at FIG. 2B the area extents of the structured layers shown there can be just as large as those described and illustrated by FIGS. 2C and 2D.

FIG. 2E shows a sectional view of a piezoelectric multilayer component, wherein a structured layer 4 is in each case arranged on the same piezoceramic layer 2 as an electrode layer 3. In this case, the respective structured layers 4 are only arranged in inactive zones IZ of the stack 1 of the multilayer component. The structured layers 4 themselves are explained in greater detail with the aid of the following FIGS. 3 and 4.

Figure 3A:
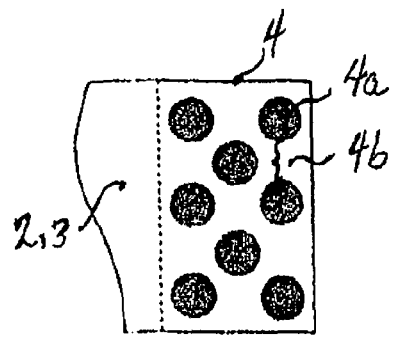
FIG. 3A shows a plan view of a structured layer with cylindrical connecting elements.

FIG. 3A is a plan view of a structured layer 4 having cylindrical connecting elements 4a, which preferably have circular contours. The pattern of the structured layer printed on the piezoceramic layer is therefore one of pillar-shaped connecting elements spaced apart from one another. The connecting elements 4a can be applied to the corresponding piezoceramic layer in this pattern by means of a screen printing method, for example, wherein the positioning of the connecting elements within the stack could be organized in accordance with the preceding FIGS. 2A to 2E. The structured layers can correspondingly be arranged alongside an electrode layer 3 or alongside an unprinted region of a piezoceramic layer 2, for which reason the region alongside the structured layer 4 is marked with both reference symbols 2 and 3 in this figure. The connecting elements 4a are continuous and connected to two piezoceramic layers 2 that are adjacent in the stacking direction. That is to say that they are already in the state of the stack before it is pressed.

The structured layer comprises one or a plurality of gaps or cavities 4b alongside the connecting elements 4a at least before the stack is pressed.

Figure 3B:
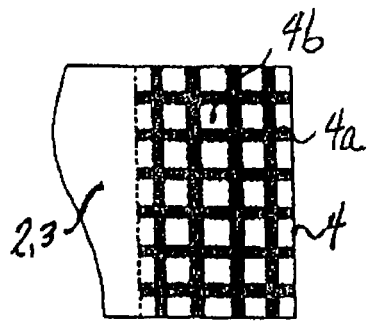
FIG. 3B shows a plan view of a lattice-shaped structure of a layer that is arranged on a piezoceramic layer.

FIG. 3B shows a lattice-shaped connecting element 4a of a structured layer 4, which is arranged on an edge region of a piezoceramic layer 2 and can extend as far as an external contact arranged on a side area of the stack. This connecting structure, too, can be printed onto the piezoceramic layer by means of a screen printing method.

Figure 3C:
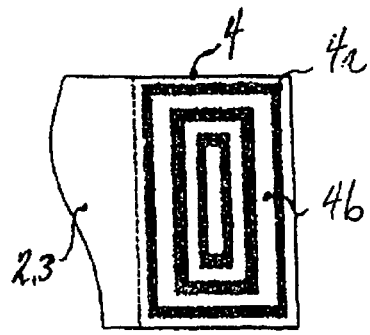
FIG. 3C shows a plan view of a structured layer with concentric structures.

FIG. 3C shows an alternative embodiment of a structured layer 4, the structures or connecting elements 4a of which are arranged in ring-shaped fashion and concentrically in an edge region of a piezoceramic layer 2. In particular, the respective connecting elements are rectangular.

The connection elements 4a of the structured layer 4 can be printed onto the desired piezoceramic layer 2 through the correspondingly shaped cutouts of a mask.

A ceramic or a metallic material can be pressed through a screen or through a mask in order to produce the desired structure on the piezoceramic layer.

Figure 4A:
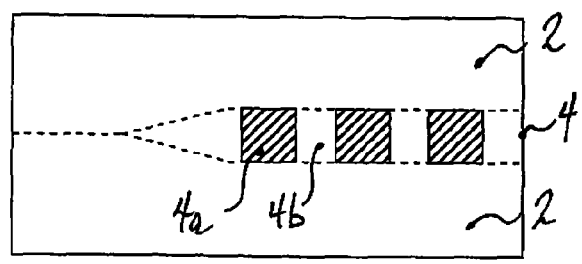
FIG. 4A shows a lateral cross-sectional view of a part of a multilayer stack with a structured layer prior to pressing of the stack.

FIG. 4a shows a longitudinal section of a region of the stack already shown by the previous figures, the region shown comprising a piezoelectrically inactive zone of the stack. The illustration shows stacked adjacent piezoceramic layers 2 between which a structured layer 4 is arranged. The latter comprises a plurality of connecting elements 4a in the form of standing cylinders or pillars by which the corresponding piezoceramic layers are already connected to one another. Interspaces 4b are present alongside the connecting elements 4a. The interspaces, prior to the pressing, are initially filled with air or with a medium that can be removed during the pressing.

Figure 4B:
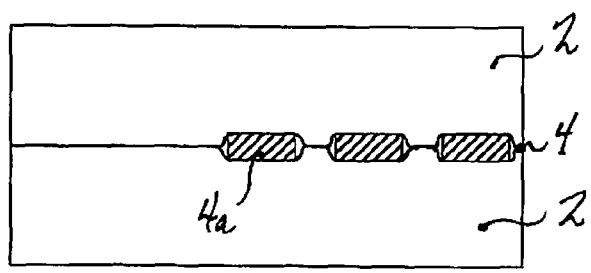
FIG. 4B shows a lateral cross-sectional view of a part of a multilayer stack with a structured layer during or after the pressing of the stack.

FIG. 4b shows the state of the region of the stack shown by FIG. 4a during or after the pressing of the stack. The gaps 4b previously still present have been filled with material of the piezoceramic layers 2 in the meantime on account of the pressing operation, to be precise in such a way that a mechanical connection between the piezoceramic layers arises by means of the interspace or interspaces alongside the connecting elements 4a. In this case, however, the strength—produced during the pressing—of the mechanical connection in the region of the connecting elements is still higher than that in the region of the interspaces filled with the piezoceramic material. During the pressing, however, it is not possible to rule out the situation that the interspace alongside the connecting elements still has one or a plurality of gaps. However, this changes nothing else in respect of the circumstance that a mechanical connection of lesser strength between the connecting elements in the interspace nevertheless arises.

The areas of the piezoceramic layers on which the structured layers 4 are applied can be larger, smaller or equal in size relative to the area of an insulating region between an electrode layer and an external contact of opposite polarity that is arranged onto a side area of the stack.

The structure, structures or connecting elements of a structured layer can consist of a metal or of an electrically non-conductive material, or at least contain the corresponding materials. These materials are preferably identical to those in the electrode layers or in the piezoceramic layers of the same piezoelectric multilayer component. This advantageously makes it possible to prevent additional chemical reactions between different materials of the multilayer component, in particular during its production.

The number of piezoceramic layers to which the structured layers described are applied can be of any desired magnitude. However, a structured layer of the type described is applied on at least one piezoceramic layer. It is also possible, however, for all the piezoceramic layers in the multilayer component to be printed with a structured layer.

The following table shows preferred ratios between the sum of the areas of the connecting elements 4a of a structured layer and the sum of the areas of the interspaces 4b alongside the connecting elements.

|                 | Sum of the areas of connecting elements | Sum of the areas of interspaces |
|-----------------|-----------------------------------------|--------------------------------|
| Preferably      | from 10 to                              | 1                              |
|                 | to 1 to                                 | 10                             |
| More preferably | from 2 to                               | 1                              |
|                 | to 1 to                                 | 4                              |

What is claimed is:

1. A piezoelectric multilayer component, comprising:
   a stack of piezoceramic layers and electrode layers arranged one above another;
   wherein at least one piezoceramic layer is printed with a layer structured according to a predefined pattern in a piezoelectrically inactive zone of the stack;
   wherein the structured layer has at least one connecting element by which piezoceramic layers that are adjacent in the stacking direction are mechanically connected to one another with a first strength;
   wherein the structured layer has interspaces filled at least in part with piezoceramic material of the adjacent piezoceramic layers; and
   wherein the adjacent piezoceramic layers in the interspaces are mechanically connected to one another with a second strength that is less than the first strength.

2. The piezoelectric multilayer component as claimed in claim 1, wherein the mechanical connection with second strength between adjacent piezoceramic layers in the interspaces arose during pressing of the stack of the multilayer component.

3. The piezoelectric multilayer component as claimed in claim 1, wherein the connecting elements comprise standing cylindrical structures.

4. The piezoelectric multilayer component as claimed in claim 3, wherein the cylindrical structures are present at distances from one another in a uniform arrangement.

5. The piezoelectric multilayer component as claimed in claim 1, wherein the at least one connecting element comprises a lattice-shaped structure.

6. The piezoelectric multilayer component as claimed in claim 1, wherein the at least one connecting element comprises a ring-shaped structure.

7. The piezoelectric multilayer component as claimed in claim 6, wherein the structured layer comprises a plurality of connecting elements in the form of a plurality of ring-shaped structures arranged concentrically.

8. The piezoelectric multilayer component as claimed in claim 1, wherein the structured layer contains a same metal that is contained in the electrode layers.

9. The piezoelectric multilayer component as claimed in claim 1, wherein the structured layer contains a same material that is contained in the piezoceramic layers.

10. The piezoelectric multilayer component as claimed in claim 1, wherein the structured layer is arranged on the same piezoceramic layer as an electrode layer.

11. The piezoelectric multilayer component as claimed in claim 1, wherein the structured layer is arranged on a piezoceramic layer upon which no electrode layer is arranged.

12. The piezoelectric multilayer component as claimed in claim 1, wherein the structured layer is additionally printed on a piezoelectric layer in an active zone of the stack.

13. The piezoelectric multilayer component as claimed in claim 1, wherein a plurality of structured layers on a plurality of piezoceramic layers is distributed through the height of the stack.

* * * * *